(12) United States Patent
Li et al.

(10) Patent No.: US 9,860,977 B1
(45) Date of Patent: Jan. 2, 2018

(54) TRANSPARENT FLEXIBLE PRINTED CIRCUIT BOARD AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Cheng-Jia Li, Qinhuangdao (CN); Ming-Hua Du, Qinhuangdao (CN); Gang Yuan, Shenzhen (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 15/666,832

(22) Filed: Aug. 2, 2017

(30) Foreign Application Priority Data

Jun. 30, 2017 (CN) .......................... 2017 1 0522073

(51) Int. Cl.
| | |
|---|---|
| *H05K 3/00* | (2006.01) |
| *H05K 1/02* | (2006.01) |
| *H05K 3/40* | (2006.01) |
| *H05K 3/02* | (2006.01) |
| *H05K 3/06* | (2006.01) |
| *H05K 3/28* | (2006.01) |
| *H05K 1/11* | (2006.01) |

(Continued)

(52) U.S. Cl.
CPC ........... *H05K 1/028* (2013.01); *H05K 1/0274* (2013.01); *H05K 1/0346* (2013.01); *H05K 1/095* (2013.01); *H05K 1/115* (2013.01); *H05K 3/0017* (2013.01); *H05K 3/027* (2013.01); *H05K 3/06* (2013.01); *H05K 3/28* (2013.01); *H05K 3/4069* (2013.01); *H05K 2201/0108* (2013.01); *H05K 2201/0154* (2013.01); *H05K 2201/0209* (2013.01); *H05K 2201/0329* (2013.01); *H05K 2201/09036* (2013.01); *H05K 2203/121* (2013.01)

(58) Field of Classification Search
CPC .. H05K 1/0277; H05K 1/0278; H05K 1/0281; H05K 1/0283; H05K 3/0017; H05K 3/0044
See application file for complete search history.

(56) References Cited

U.S. PATENT DOCUMENTS

2012/0189874 A1* 7/2012 Inoue ................... C08K 5/3472
429/7
2015/0101847 A1* 4/2015 Tsai ..................... H05K 3/4691
174/254

(Continued)

*Primary Examiner* — Jeremy C Norris
(74) *Attorney, Agent, or Firm* — ScienBiziP, P.C.

(57) ABSTRACT

A transparent flexible printed circuit board (FPCB) of reduced thickness but good conductivity and transparency includes an insulating resin layer. The insulating resin layer has a first surface and a second surface. At least one through hole is defined in the insulating resin layer through the first surface and the second surface. A conductive wiring layer is formed on the first surface and a wiring layer is formed on the second surface. The conductive wiring layers are made of electrically conductive resin, and have wiring openings. A cover film covers each of the conductive wiring layers, and further infills the wiring openings.

11 Claims, 6 Drawing Sheets

(51) Int. Cl.
    *H05K 1/03*     (2006.01)
    *H05K 1/09*     (2006.01)

(56) References Cited

U.S. PATENT DOCUMENTS

2015/0370384 A1* 12/2015 Park .................. G06F 3/038
                                                    345/174
2016/0270242 A1*  9/2016 Kim .................. H05K 3/4644

* cited by examiner

TRANSPARENT FLEXIBLE PRINTED CIRCUIT BOARD AND METHOD FOR MANUFACTURING THE SAME

FIELD

The subject matter herein generally relates to circuit boards, and particularly, to a transparent flexible printed circuit board (FPCB) and a method for manufacturing the transparent FPCB.

BACKGROUND

Transparent circuit boards are used in various kinds of electronic devices. The transparent circuit board includes a transparent substrate and electrically conductive wiring formed on the substrate. Electrical components under the transparent circuit board can be observed by a user. Manufacturing a visually transparent circuit board with a good flexibility is problematic. Improvements in the art are preferred.

BRIEF DESCRIPTION OF THE DRAWINGS

Implementations of the technology in the present disclosure will now be described, by way of example only, with reference to the attached figures.

DETAILED DESCRIPTION

Figure 1:
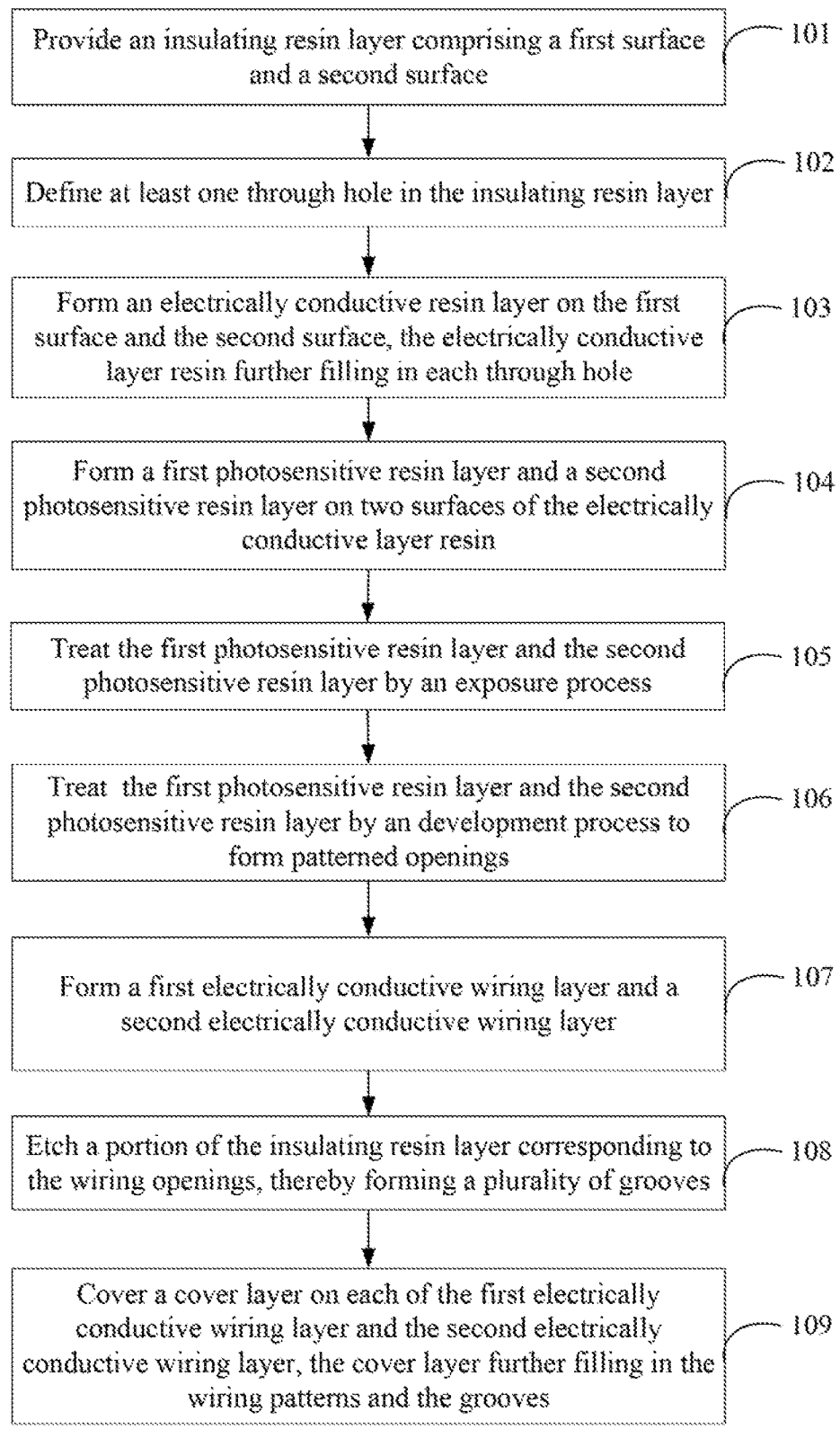
FIG. 1 is a flowchart of an exemplary embodiment of a method for manufacturing a transparent FPCB.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Referring to FIG. 1, a method for manufacturing a transparent flexible printed circuit board (FPCB) is presented in accordance with a first exemplary embodiment. The method for manufacturing the transparent FPCB is provided by way of example, as there are a variety of ways to carry out the method. The exemplary method can begin at block 101.

Figure 2:
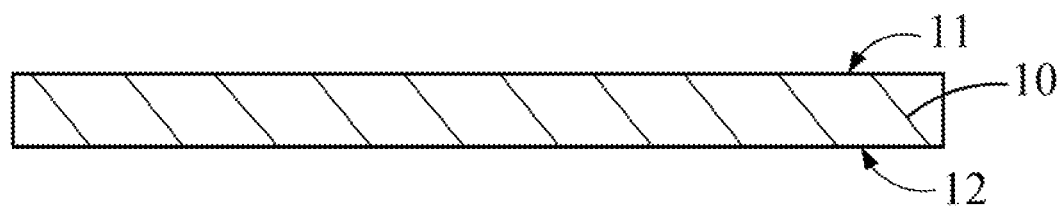
FIG. 2 is a diagram of an insulating resin layer used in the method of FIG. 1.

At block 101, referring to FIG. 2, an insulating resin layer 10 is provided that comprises a first surface 11 and a second surface 12 facing away from the first surface 11.

The insulating resin layer 10 can be made of polyimide (PI, chemical formula:

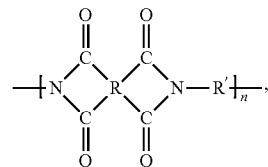

where R can be selected from a group consisting of

,

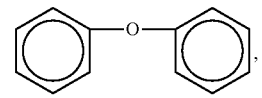, and

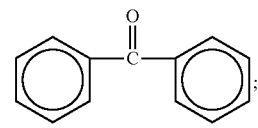;

where R' can be selected from a group consisting of

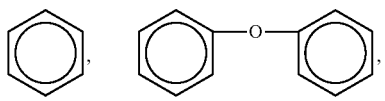

and

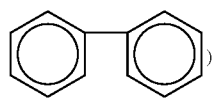

that has good electrical insulating property. The polyimide has a dielectric loss of $10^{-3}$, a dielectric strength of 100~300 kV/mm, and a volume resistivity of 1017 Ω·cm.

In at least one exemplary embodiment, the insulating resin layer 10 can cut off ultraviolet light of 320 nm or less in wavelength, and has a transmissivity for visible light of 84% or more. That is, the insulating resin layer 10 is nearly transparent from view of a user.

Several methods can be used to improve the transparency of the insulating resin layer 10. For example, grafting fluorine-contained groups to the backbone of the polyimide, decreasing the amount of aromatic structures in the polyimide, or adding a non-coplanar structure or sulfonyl groups to the polyimide, to prevent the generation of charge transfer complex (CTC). In another exemplary embodiment, adding diamido with a meta-substituted structure to the polyimide to inhibit conjugated effect.

Figure 3:
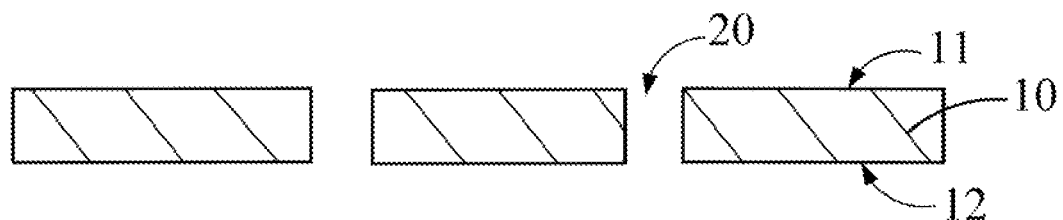
FIG. 3 is a diagram showing at least one through hole defined in the insulating resin layer of FIG. 2.

At block 102, referring to FIG. 3, at least one through hole 20 is defined in the insulating resin layer 10 through the first surface 11 and the second surface 12. In at least one exemplary embodiment, the through hole 20 is formed by laser or drilling.

Figure 4:
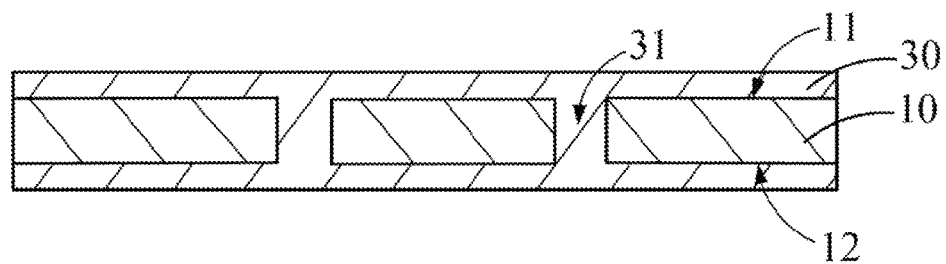
FIG. 4 is a diagram of an electrically conductive resin layer formed on the insulating resin layer of FIG. 3.

At block 103, referring to FIG. 4, an electrically conductive resin layer 30 is formed on the first surface 11 and the second surface 12, and further fills in each through hole 20 to form an electrically conductive portion 31.

In at least one exemplary embodiment, the electrically conductive resin layer 30 is made of electrically conductive polyimide that has electrically conductivity. The electrically conductive resin layer 30 has a transmissivity for visible light of 60% or more. The electrically conductive resin layer 30 can be formed on the first surface 11 and the second surface 12 by a coating process. The electrically conductive polyimide can be a metal hybridization polyimide formed by hybridizing metal to polyimide through a sol-gel method or an ion exchanging method. When the metal is palladium (Pd) or silver-gold (Ag—Au) alloy, the metal is presented as elementary substance, so that a composite material of metal and polyimide can be formed. When the metal is lithium (Li), aluminum (Al), or tin (Sn), the metal is presented as metal ion that is grafted to the backbone or side chain of the polyimide. Different metals can cause the electrically conductive resin layer 30 to have different electrical conductivities. Thus, the electrical conductivity of the electrically conductive resin layer 30 can be adjusted by changing the type of the metal. Moreover, when the electrically conductive resin layer 30 is etched to form conductive wiring (see following block 107), the electrically conductive resin layer 30 can function as an embedded resistance with a resistance value that can be calculated according to dimensions of the conductive wiring.

Figure 5:
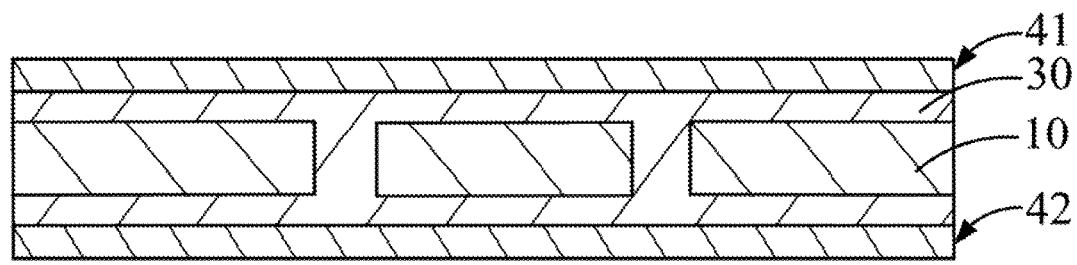
FIG. 5 is a diagram showing a first photosensitive resin layer and a second photosensitive resin layer formed on the electrically conductive resin layer of FIG. 4.

At block 104, referring to FIG. 5, a first photosensitive resin layer 41 and a second photosensitive resin layer 42 are respectively formed on two surfaces of the electrically conductive resin layer 30 facing away from the insulating resin layer 10.

The first photosensitive resin layer 41 and the second photosensitive resin layer 42 are made of photosensitive polyimide that has photosensitive property. In at least one exemplary embodiment, the photosensitive polyimide is a composite material of metal oxide and polyimide. The metal oxide can be titanium dioxide or zinc oxide.

Figure 6:
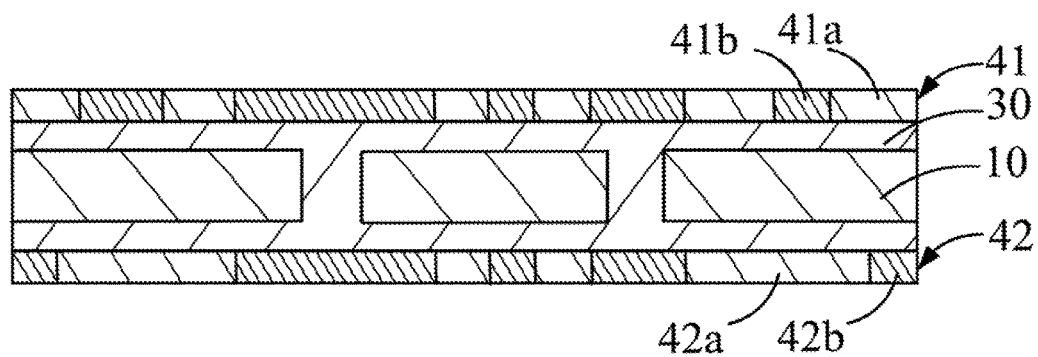
FIG. 6 is a diagram showing the first and the second photosensitive resin layers of FIG. 5 treated by an exposure process.

At block 105, referring to FIG. 6, the first photosensitive resin layer 41 and the second photosensitive resin layer 42 are treated by an exposure process.

In at least one exemplary embodiment, the exposure process can be carried out by attaching wiring patterns (not shown) on the first photosensitive resin layer 41 and the second photosensitive resin layer 42, and exposing the first photosensitive resin layer 41 and the second photosensitive resin layer 42 to ultraviolet radiation, so that a portion of the first photosensitive resin layer 41 and a portion of the second photosensitive resin layer 42, which are each exposed from the wiring patterns (that is, exposed portion 41a of the first photosensitive resin layer 41 and exposed portion 42a of the second photosensitive resin layer 42), are solidified under the ultraviolet radiation. The remaining and unexposed portion 41b of the first photosensitive resin layer 41 and the remaining and unexposed portion 42b of the second photosensitive resin layer 42 are not solidified.

Figure 7:
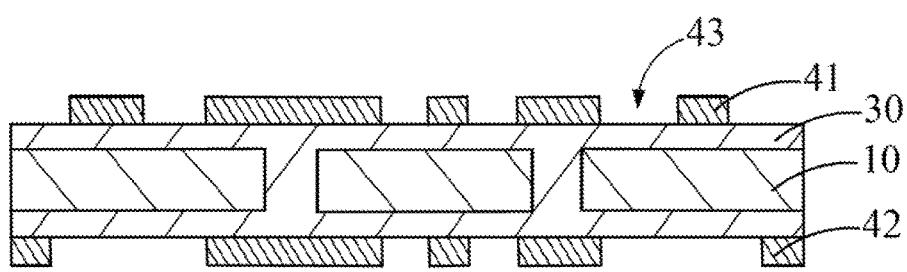
FIG. 7 is a diagram showing the first and the second photosensitive resin layers of FIG. 6 treated by a development process.

At block 106, referring to FIG. 7, the first photosensitive resin layer 41 and the second photosensitive resin layer 42 after the exposure are treated by a development process, thus forming a plurality of patterned openings 43 in the first photosensitive resin layer 41 and the second photosensitive resin layer 42, to expose a portion of the electrically conductive resin layer 30.

In at least one exemplary embodiment, the development process can be carried out by immersing the first photosensitive resin layer 41 and the second photosensitive resin layer 42 into a developer solution. Thus, the exposed portions 41a and 42a are etched by the developer solution to form the patterned openings 43. In at least one exemplary embodiment, the developer solution is a sodium hydroxide solution having a mass concentration of about 1%.

Figure 8:
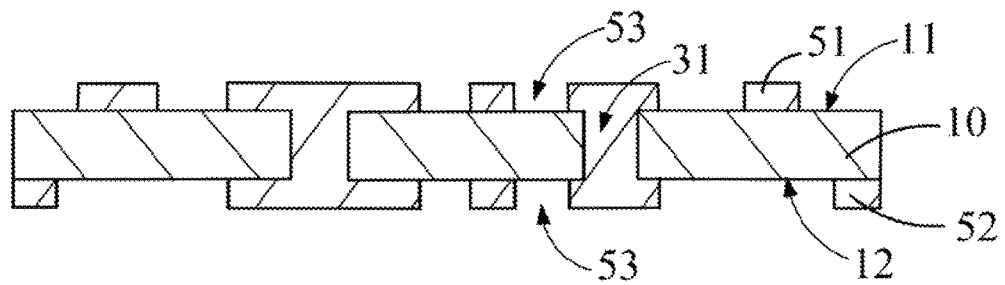
FIG. 8 is a diagram showing the first and the second photosensitive resin layers, and the electrically conductive resin layer of FIG. 7 etched to form a first electrically conductive wiring layer and a second electrically conductive wiring layer.

At block 107, referring to FIG. 8, the first photosensitive resin layer 41, the second photosensitive resin layer 42, and the exposed portion of the electrically conductive resin layer 30 are etched, thus forming a first electrically conductive wiring layer 51 and a second electrically conductive wiring layer 52, respectively on the first surface 11 and the second surface 12. Each of the first electrically conductive wiring layer 51 and the second electrically conductive wiring layer 52 has a plurality of wiring openings 53. The first electrically conductive wiring layer 51 and the second electrically conductive wiring layer 52 are electrically connected to each other through the electrically conductive portion 31.

In at least one exemplary embodiment, the etching process can be carried out by immersing the product into an alkaline solution, until the first photosensitive resin layer 41 and the second photosensitive resin layer 42 are observed to be completely etched. The product is then separated from the alkaline solution.

Figure 9:
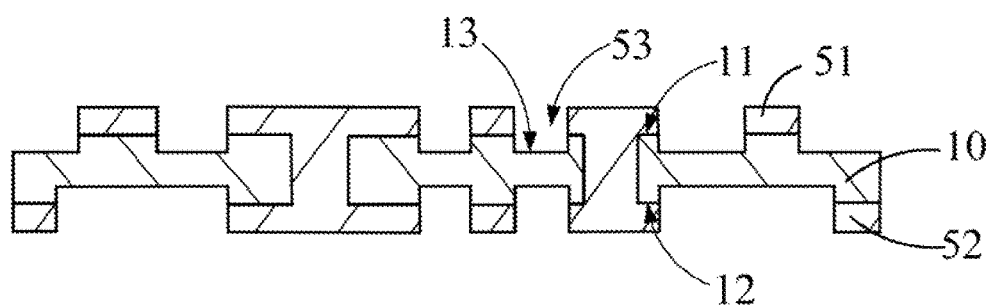
FIG. 9 is a diagram showing the insulating resin layer of FIG. 8 etched to form grooves.

At block 108, referring to FIG. 9, a portion of the insulating resin layer 10 corresponding to the wiring openings 53 is etched, thus forming a number of grooves 13 depressed from the first surface 11 and the second surface 12, and the grooves 13 correspond to the wiring openings 53.

In at least one exemplary embodiment, since the insulating resin layer 10 is made of polyimide, the portion of the insulating resin layer 10 corresponding to the wiring openings 53 can also be etched by the alkaline solution.

Figure 10:
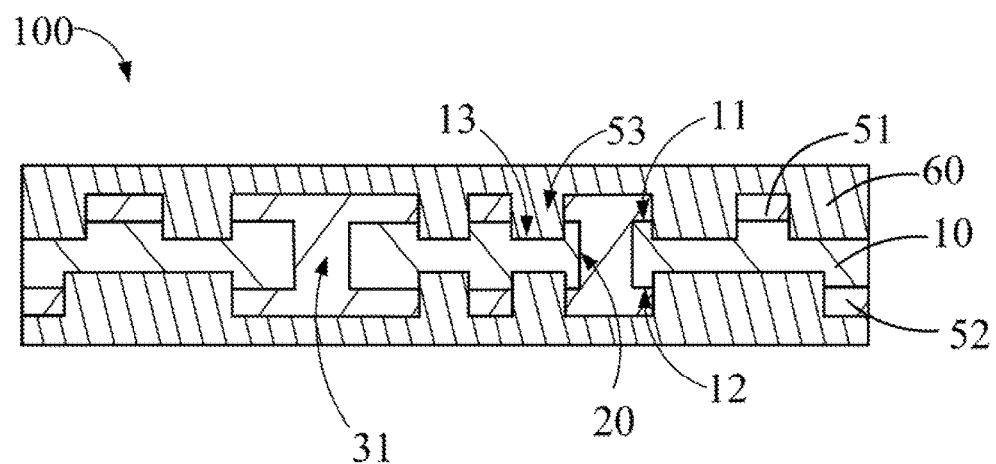
FIG. 10 is a diagram showing two cover films formed on the first and the second electrically conductive wiring layers of FIG. 9, to form the transparent FPCB.

At block 109, referring to FIG. 10, a cover film 60 is formed. The cover film 60 covers each of the first electrically conductive wiring layer 51 and the second electrically conductive wiring layer 52, and further fills in the grooves 13 and the wiring openings 53, thus obtaining the transparent FPCB 100.

The cover film 60 has a transmissivity for visible light of 84% or more. In at least one exemplary embodiment, the cover film 60 can further comprise a cover layer (not shown) and an adhesive layer (not shown) connected to the cover layer. The cover layer is made of polyimide. The adhesive layer is made of optical adhesive which has a transmissivity for visible light of 99% or more and a fog level of 0.5% or less.

FIG. 9 illustrates an exemplary embodiment of a transparent FPCB 100. The transparent FPCB 100 comprises an insulating resin layer 10. The insulating resin layer 10 can be made of polyimide. The insulating resin layer 10 comprises a first surface 11 and a second surface 12 facing away from the first surface 11.

The insulating resin layer 10 defines a number of grooves 13 depressed from the first surface 11 and the second surface 12. The insulating resin layer 10 further defines at least one through hole 20 through the first surface 11 and the second surface 12. A first electrically conductive wiring layer 51 and a second electrically conductive wiring layer 52 are respectively formed on the first surface 11 and the second surface 12. The first electrically conductive wiring layer 51 and the second electrically conductive wiring layer 52 can be made of electrically conductive polyimide. The first electrically conductive wiring layer 51 and the second electrically conductive wiring layer 52 fill in each through hole 20 to form an electrically conductive portion 31 that connects the first electrically conductive wiring layer 51 and the second electrically conductive wiring layer 52. Each of the first electrically conductive wiring layer 51 and the second electrically conductive wiring layer 52 has wiring openings 53 corresponding to the grooves 13.

A cover film 60 covers each of the first electrically conductive wiring layer 51 and the second electrically conductive wiring layer 52, and further fills in the grooves 13 and the wiring openings 53. In at least one exemplary embodiment, the cover film 60 can further comprise a cover layer (not shown) and an adhesive layer (not shown) connected to the cover layer. The cover layer is made of polyimide. The adhesive layer is made of optical adhesive.

This method comprises no electroplating process and the insulating resin layer 10 comprises no copper foils, thus the transparent FPCB 100 can have a reduced thickness. Since the insulating resin layer 10 is made of polyimide (transmissivity for visible light of 84% or more), the first electrically conductive wiring layer 51 and the second electrically conductive wiring layer 52 are made of electrically conductive polyimide (transmissivity for visible light of 60% or more), and the cover film 60 comprises polyimide (transmissivity for visible light of 84% or more), thus, insulating resin layer 10, the first electrically conductive wiring layer 51, the second electrically conductive wiring layer 52, and the cover film 60 cooperatively define the transparency of the transparent FPCB 100. Thus, the transparent FPCB 100 can be nearly transparent from view of the user. Since the transparent FPCB 100 is completely made of resin, the transparent FPCB 100 can further have an improved flexibility, and the conductive wiring is not easily fractured when the transparent FPCB 100 is bent.

Furthermore, since the first photosensitive resin layer 41 and the second photosensitive resin layer 42 are made of photosensitive polyimide, the first photosensitive resin layer 41 and the second photosensitive resin layer 42 can be etched together with the electrically conductive resin layer 30. There is no need to individually remove the first photosensitive resin layer 41 and the second photosensitive resin layer 42, thus, decreasing the cost of manufacturing. Moreover, the portion of the insulating resin layer 10 corresponding to the wiring openings 53 is etched to form the grooves 13, short circuiting and electrical skin effect are thus prevented. The through hole 20 is defined in the insulating resin layer 10 other than in a conventional copper-clad laminate (CCL). Thus, the method is further simplified, and the size of the through hole 20 is decreased.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A transparent flexible printed circuit board (FPCB) comprising:
   an insulating resin layer comprising a first surface and a second surface facing away from the first surface;
   at least one through hole defined in the insulating resin layer through the first surface and the second surface;
   a first electrically conductive wiring layer formed on the first surface;
   a second electrically conductive wiring layer formed on the second surface, the first electrically conductive wiring layer and the second electrically conductive wiring layer made of electrically conductive resin, the first electrically conductive wiring layer and the second electrically conductive wiring layer filling in each through hole to form an electrically conductive portion, each of the first electrically conductive wiring layer and the second electrically conductive wiring layer has a plurality of wiring openings; and
   a cover film covering each of the first electrically conductive wiring layer and the second electrically conductive wiring layer, and further filling in the plurality of wiring openings.

2. The transparent FPCB of claim 1, wherein a plurality of grooves is further defined in the insulating resin layer that depressed from the first surface and the second surface and corresponding to the plurality of wiring openings, and the cover film further fills in the plurality of grooves.

3. The transparent FPCB of claim 1, wherein the insulating resin layer is made of polyimide, the first electrically conductive wiring layer and the second electrically conductive wiring layer are made of electrically conductive polyimide, and the cover film comprises polyimide.

4. A method for manufacturing a transparent flexible printed circuit board (FPCB) comprising:
   providing an insulating resin layer comprising a first surface and a second surface facing away from the first surface;
   defining at least one through hole in the insulating resin layer through the first surface and the second surface;

forming an electrically conductive resin layer on the first surface and the second surface, the electrically conductive resin layer further filling in each through hole to form an electrically conductive portion;

forming a first photosensitive resin layer and a second photosensitive resin layer respectively on two surfaces of the electrically conductive resin layer facing away from the insulating resin layer;

treating the first photosensitive resin layer and the second photosensitive resin layer by an exposure and development process, thereby forming a plurality of patterned openings in the first photosensitive resin layer and the second photosensitive resin layer to expose a portion of the electrically conductive resin layer;

etching the first photosensitive resin layer, the second photosensitive resin layer, and the exposed portion of the electrically conductive resin layer, thereby forming a first electrically conductive wiring layer and a second electrically conductive wiring layer respectively on the first surface and the second surface, each of the first electrically conductive wiring layer and the second electrically conductive wiring layer having a plurality of wiring openings, the first electrically conductive wiring layer and the second electrically conductive wiring layer electrically connected to each other through the electrically conductive portion; and forming a cover film, the cover film covering each of the first electrically conductive wiring layer and the second electrically conductive wiring layer, the cover film further filling in the plurality of wiring openings, thereby obtaining the transparent FPCB.

5. The method of claim 4, wherein before the step of covering a cover film on each of the first electrically conductive wiring layer and the second electrically conductive wiring layer, further comprising:

etching a portion of the insulating resin layer corresponding to the plurality of wiring openings, thereby forming a plurality of grooves depressed from the first surface and the second surface and corresponding to the plurality of wiring openings;

wherein the cover film further fills in the plurality of grooves.

6. The method of claim 4, wherein the insulating resin layer is made of polyimide, the electrically conductive resin layer is made of electrically conductive polyimide, the first photosensitive resin layer and the second photosensitive resin layer are made of photosensitive polyimide, and the cover film comprises polyimide.

7. The method of claim 6, wherein the electrically conductive resin layer is formed on the first surface and the second surface by a coating process.

8. The method of claim 6, wherein the electrically conductive polyimide is a metal hybridization polyimide formed by hybridizing metal to polyimide.

9. The method of claim 6, wherein the photosensitive polyimide is a composite material of metal oxide and polyimide.

10. The method of claim 9, wherein the metal oxide is titanium dioxide or zinc oxide.

11. The method of claim 6, wherein the insulating resin layer has a transmissivity for visible light of 84% or more, the first electrically conductive wiring layer and the second electrically conductive wiring layer has a transmissivity for visible light of 60% or more, and the cover film has a transmissivity for visible light of 84% or more.

* * * * *